United States Patent
Wu et al.

(10) Patent No.: US 10,939,538 B1
(45) Date of Patent: Mar. 2, 2021

(54) CIRCUIT BOARD STRUCTURE

(71) Applicant: Unimicron Technology Corp., Taoyuan (TW)

(72) Inventors: Ming-Hao Wu, Taoyuan (TW); Shao-Chien Lee, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/907,298

(22) Filed: Jun. 21, 2020

(30) Foreign Application Priority Data

Apr. 24, 2020 (TW) .................................. 109113855

(51) Int. Cl.
*H05K 1/02* (2006.01)

(52) U.S. Cl.
CPC .................. *H05K 1/0204* (2013.01)

(58) Field of Classification Search
CPC ..... H05K 1/0201; H05K 1/0203; H05K 1/204
See application file for complete search history.

(56) References Cited

U.S. PATENT DOCUMENTS

| | | | | |
|---|---|---|---|---|
| 6,917,523 | B2 * | 7/2005 | Summers | H05K 1/0204 165/185 |
| 2006/0068577 | A1 * | 3/2006 | Lee | H05K 3/4038 438/597 |
| 2010/0000766 | A1 * | 1/2010 | Loiselet | H05K 1/0203 174/252 |
| 2011/0192630 | A1 * | 8/2011 | Ishino | H01L 21/56 174/76 |
| 2013/0269986 | A1 * | 10/2013 | Sun | H01L 23/5383 174/252 |
| 2013/0323602 | A1 * | 12/2013 | Matsunaga | B22F 7/04 429/236 |

FOREIGN PATENT DOCUMENTS

| | | |
|---|---|---|
| CN | 108990273 | 12/2018 |
| CN | 107734837 | 12/2019 |
| TW | M575954 | 3/2019 |

OTHER PUBLICATIONS

"Office Action of Taiwan Counterpart Application", dated Oct. 16, 2020, p. 1-p. 8.

* cited by examiner

*Primary Examiner* — Hoa C Nguyen
(74) *Attorney, Agent, or Firm* — JCIPRNET

(57) ABSTRACT

A circuit board structure includes a circuit board, at least a through hole, and at least a heat dissipating structure. The circuit board has two opposite surfaces. A metal layer is disposed on each of the opposite surfaces of the circuit board. The through hole is disposed in the circuit board, and the through hole penetrates through the circuit board. The heat dissipating structure is disposed in the through hole. The heat dissipating structure includes a first metal block and a second metal block. The first metal block and the second metal block are joined together in the through hole and have an interface.

12 Claims, 4 Drawing Sheets

CIRCUIT BOARD STRUCTURE

CROSS-REFERENCE TO RELATED APPLICATION

This application claims the priority benefit of Taiwan application serial no. 109113855, filed on Apr. 24, 2020. The entirety of the above-mentioned patent application is hereby incorporated by reference herein and made a part of this specification.

BACKGROUND

Technical Field

The present invention relates to a circuit board, and particularly to a circuit board structure with a heat dissipation structure.

Description of Related Art

In recent years, in order to increase the application of printed circuit boards (PCBs), there are many current technologies that form the printed circuit board as a multi-layer circuit structure, in order to increase its internal space for circuit layouts. The manufacturing method of the multi-layer circuit board is to stack the laminated structure composed of copper foil and prepreg (PP) repeatedly, and laminate it on the core board, so as to increase the interior wiring space of the circuit board. The electroplating process is used to fill the through holes or blind holes of each laminated structure with conductive materials, so as to conduct each of the layers. In addition, many different types of components, such as chips, connectors, optoelectronic components or heat dissipating components, may also be disposed in the multi-layer circuit boards in accordance to requirements, so as to increase functions of the multi-layer circuit boards.

Taking high-power electronic components disposed in the circuit structure as an example, because high-power electronic components generate a lot of heat energy during operation, it will cause reliability problems to the circuit board. Therefore, how to improve the heat dissipating capability of the circuit board is an urgent problem to be solved in this field.

SUMMARY

The present invention provides a circuit board structure, which has a good heat dissipating capability, the manufacturing process is simple, and has good quality.

The circuit board structure of the present invention includes a circuit board, at least one through hole, and at least one heat dissipating structure. The circuit board has two opposite surfaces. A metal layer is disposed on each of the opposite surfaces of the circuit board. The through hole is disposed in the circuit board, and the through hole penetrates through the circuit board. The heat dissipating structure is disposed in the through hole. The heat dissipating structure includes a first metal block and a second metal block. The first metal block and the second metal block are joined in the through hole and have an interface.

In an embodiment of the present invention, the above-mentioned circuit board structure further includes an interface material. The interface material is filled in the through hole, and surrounding the heat dissipating structure. A gap is between the heat dissipating structure and an inner wall of the through hole. The interface material is disposed in the gap, so as to fix the heat dissipating structure in the circuit board.

In an embodiment of the present invention, a side surface of the at least one heat dissipating structure is a flat surface without protrusions.

In an embodiment of the invention, after the first metal block is joined to the second metal block, the heat dissipating structure is laterally deformed.

In an embodiment of the present invention, the interface is in between the first metal block and the second metal block. The crystal lattice of the first metal block on one side of the interface and the crystal lattice of the second metal block on an opposite side of the interface are discontinuously arranged.

In an embodiment of the present invention, a cross section of the interface is a complementary shaped surface between the first metal block and the second metal block.

In an embodiment of the present invention, the material of the first metal block and the second metal block includes metal materials or meal alloys selected from platinum, titanium, aluminum, copper, gold, silver, tin, and nickel.

In an embodiment of the present invention, the first metal block and the second metal block are respectively the same or different metal materials, or the same or different alloys.

In an embodiment of the present invention, the circuit board has an inner layer circuit board and a plurality of circuit build-up layers stacked on two opposite surfaces of the inner layer circuit board.

In an embodiment of the present invention, the above-mentioned circuit board structure further includes a first metal layer and a second metal layer. The first metal layer is disposed on the metal layer on a first surface of the circuit board. The second metal layer is disposed on the metal layer on a second surface of the circuit board opposite to the first surface. The first metal layer and the second metal layer overlap the heat dissipating structure.

In an embodiment of the present invention, the first metal block and the second metal block are porous metal blocks.

Based on the above, since the circuit board structure of an embodiment of the present invention has a heat dissipating structure penetrating through the circuit board, so as to quickly and efficiently transfer heat energy from one side of the circuit board to the other side. Therefore, the circuit board structure has good heat dissipating capability. In addition, the manufacturing process of the heat dissipating structure may be simple and may reduce the effect on tolerance. Therefore, the circuit board structure has the advantageous effect of reducing costs, and has good quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Some embodiments are provided hereinafter and described in detail with reference to figures. However, the embodiments provided are not intended to limit the scope of the invention. Moreover, the figures are only descriptive and are not drawn to scale. For ease of explanation, the same devices below are provided with the same reference symbols.

Moreover, terms such as "first" and "second" used herein do not represent order, and it should be understood that they are for differentiating devices or operations having the same technical terms.

Secondly, the terms "containing", "including", "having" and the like as used herein are all open-ended terms; i.e., including but not limited to.

Furthermore, the terms "in contact with", "joined", "bonded to" and the like, as used herein, may mean direct contact or indirect contact via other layers unless otherwise stated.

Figure 1:
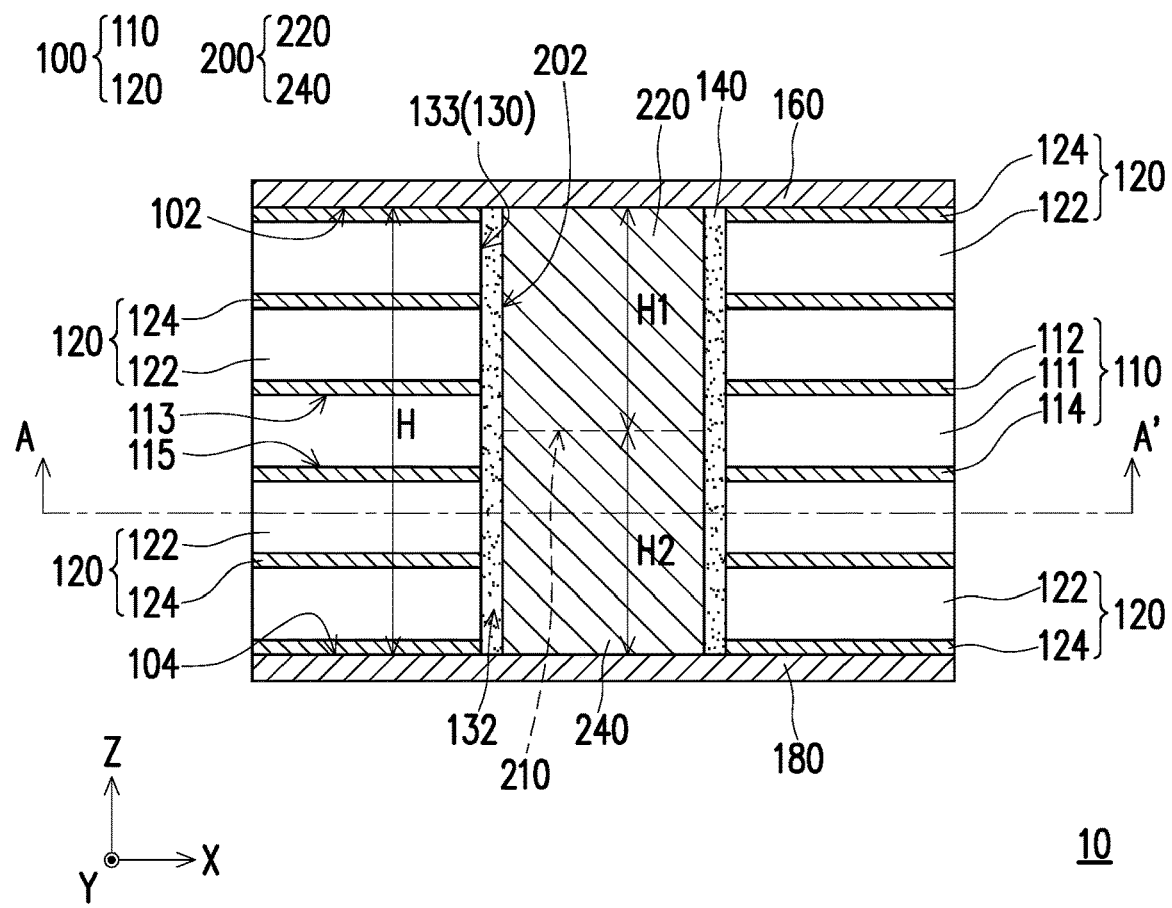
FIG. 1 is a schematic cross-sectional view of a circuit board structure according to an embodiment of the invention.
Figure 2:
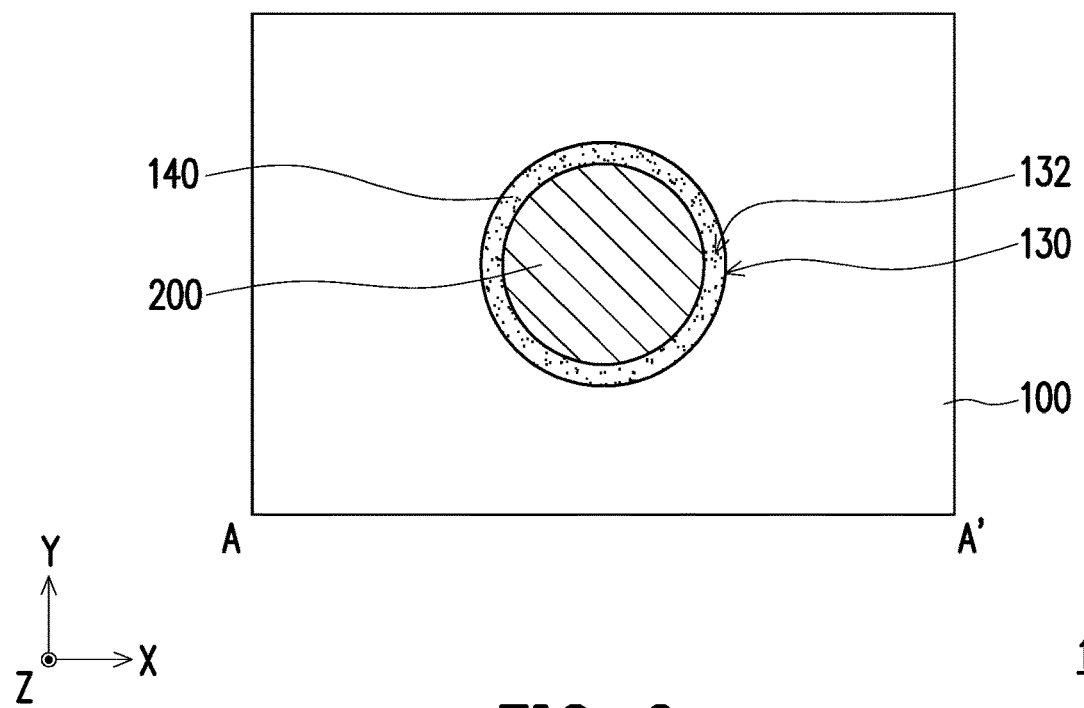
FIG. 2 is a schematic top view of line A-A' of FIG. 1.
Figure 3:
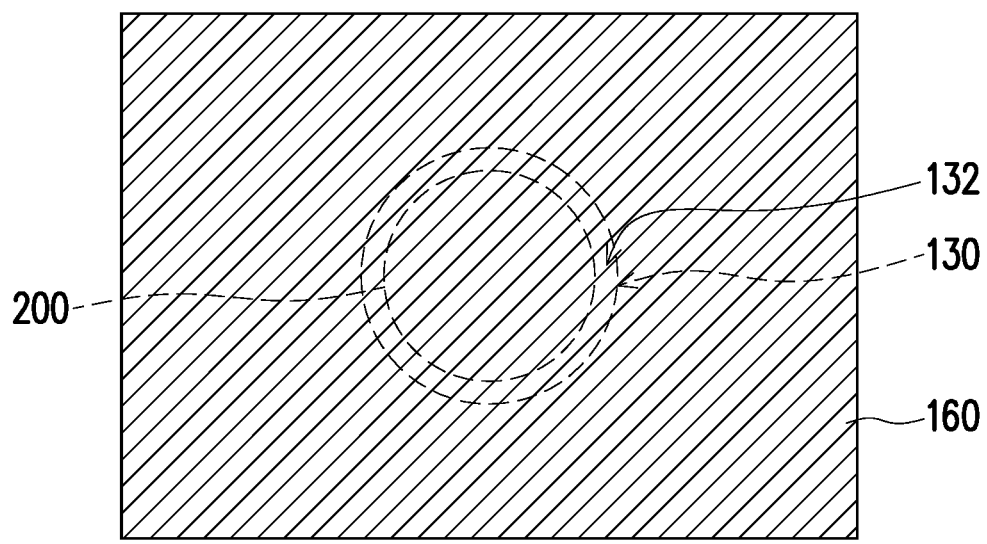
FIG. 3 is a schematic top view of a circuit board structure according to an embodiment of the invention.

FIG. 1 is a schematic cross-sectional view of a circuit board structure according to an embodiment of the invention. FIG. 2 is a schematic top view of line A-A' of FIG. 1. FIG. 3 is a schematic top view of a circuit board structure according to an embodiment of the invention. For the clarity of the drawings and the convenience of the description, FIG. 2 and FIG. 3 omit illustrating several layers or components from the figures. Please first refer to FIG. 1 and FIG. 2. The circuit board structure 10 of the embodiment includes a circuit board 100, at least one through hole 130, and at least one heat dissipating structure 200. The through hole 130 is disposed in the circuit board 100, and the through hole 130 penetrates through the circuit board 100. The heat dissipating structure 200 is disposed in the through hole 130. Under the above configuration, the heat dissipating structure 200 may quickly and effectively transfer heat energy generated by the electronic components (not illustrated) from one side of the circuit board 100 to the other side, so that the circuit board structure 10 may have good heat dissipating capability.

Please refer to FIG. 1 and FIG. 2, the circuit board structure 10 is, for example, a multilayer circuit board with a core board, which may have an application as a printed circuit board (PCB). The circuit board 100 of the circuit board structure 10 includes an inner layer circuit board 110 and a plurality of circuit build-up layers 120 stacked on two opposite surfaces of the inner circuit layer board 110.

In detail, the inner layer circuit board 110 is, for example, a core board, which has a core layer 111. The core layer 111 has an upper surface 113 and a lower surface 115 relative to the upper surface 113. The inner layer circuit board 110 also has a first conductive layer 112 and a second conductive layer 114. The first conductive layer 112 is disposed on the upper surface 113. The second conductive layer 114 is disposed on the lower surface 115. The first conductive layer 112 and the second conductive layer 114 are, for example, patterned conductive layers, but the invention is not limited thereto.

In the embodiment, the material of the core layer 111 is, for example, prepreg (PP) or other suitable dielectric materials. The materials of the first conductive layer 112 and the second conductive layer 114 include metal materials, metal nitrides, metal silicides, or combinations thereof, such as copper foil or other suitable conductive materials. In some embodiments, the above-mentioned metal materials may be, for example, platinum, titanium, aluminum, copper, gold, silver, tin, palladium or nickel, or alloys thereof, but the invention is not limited thereto. Therefore, the inner layer circuit board 110 may adopt a copper clad laminate (CCL) substrate or other substrates having the above-mentioned configurations. However, the present invention does not limit the type and formation method of the inner layer circuit board 110.

As shown in FIG. 1, a plurality of circuit build-up layers 120 may be stacked on the upper surface 113 and the lower surface 115 of the core layer 111. Specifically, the circuit build-up layer 120 includes a dielectric layer 122 and a conductive layer 124. The dielectric layer 122 of the circuit build-up layer 120 near the core layer 111 is disposed on the upper surface 113, or on the lower surface 115. The outermost circuit build-up layer 120 away from the core layer 111 is disposed on the circuit build-up layer 120 close to the core layer 111. In the embodiment, the conductive layer 124 may be a patterned conductive layer, and the conductive layers 124 of the circuit build-up layer 120 are stacked on each other, and may be electrically connected to each other. In addition, the conductive layer 124 may also be electrically connected to the first conductive layer 112 or the second conductive layer 114 of the inner layer circuit board 110. As shown in FIG. 1, the circuit board 100 of the embodiment is, for example, a multi-layer circuit board having four layers of circuit build-up layer 120, but the number of the circuit build-up layers 120 is not limited to that shown in FIG. 1. The number of layers may be increased or decreased based on requirements of the user.

In the embodiment, two of the circuit build-up layers 120 located farthest from the core layer 111 may respectively have the two opposite surfaces of the circuit board 100, such as the first surface 102 and the second surface 104 of the circuit board 100, which are opposite to each other. The conductive layer 124 may be disposed on the first surface 102 or the second surface 104 as metal layers on the two opposite surfaces of the circuit board 100. In other words, the circuit board 100 with a multilayer circuit build-up layer 120 may also be a circuit board with metal layers only on both surfaces, such as cooper clad laminate (CCL), but the embodiment is not limited thereto.

In the embodiment, the material of the dielectric layer 122 is, for example, prepreg or other suitable dielectric materials. The material of the conductive layer 124 includes metal materials, metal nitrides, metal silicides or combinations thereof, such as copper foil, or other suitable conductive materials.

Please refer to FIG. 1 and FIG. 2. FIG. 2 is a top view of one of the circuit build-up layers 120 at line A-A' in FIG. 1. In the embodiment, the through hole 130 is disposed in the circuit board 100. The through hole 130 penetrates through the inner layer circuit board 110 of the circuit board 100, and a plurality of circuit build-up layers 120. The step of forming the through hole 130 may include a mechanical drilling process, a laser drilling process, or other suitable processes. The present invention does not limit the method of forming the through hole 130.

In the embodiment, the inner wall 133 of the through hole 130 may encircle to form a circle (as shown in FIG. 2), but the present invention is not limited thereto. In some embodiments, the pattern of the through hole 130 may also be rectangular, polygonal, or irregular.

The heat dissipating structure 200 may be correspondingly disposed in the through hole 130. In the embodiment, the heat dissipating structure 200 includes the first metal block 220 and the second metal block 240. The first metal block 220 and the second metal block 240 are joined in the through hole 130 to form a heat dissipating structure 200 (eg. a heat dissipating copper pillar). The interface 210 between the first metal block 220 and the second metal block 240 is disposed in the through hole 130. In the embodiment, the crystal lattice of the first metal block 220 on one side of the interface 210 and the crystal lattice of the second metal block 240 on the opposite side of the interface 210 are discontinuously arranged.

In the embodiment, the materials of the first metal block 220 and the second metal block 240 include metal materials or alloys selected from platinum, titanium, aluminum, copper, gold, silver, tin, or nickel, but the invention is not limited thereto. In the embodiment, the material of the first metal block 220 and the material of the second metal block 240 may be the same, such as copper. In other embodiments, the material of the first metal block 220 and the material of the second metal block 240 may respectively be the same or different metal materials, or the same or different alloys. In the embodiment, the cross section of the interface 210 between the first metal block 220 and the second metal block 240 is a plane surface, but the invention is not limited thereto.

It is worth noting that, the two outermost circuit build-up layers 120 of the circuit board 100 respectively have opposite first surface 102 and second surface 104. The linear distance between the first surface 102 and the second surface 104 may define a height H of the circuit board 100. The linear distance from the interface 210 to the top surface of the first metal block 220 close to the first surface 102 may define a first height H1 of the first metal block 220. The linear distance from the interface 210 to the top surface of the second metal block 240 near the second surface 104 may define a second height H2 of the second metal block 240. The sum of the first height H1 and the second height H2 may be greater than or equal to the height H of the circuit board 100. In the embodiment, the first height H1 and the second height H2 are respectively 0.5 times of the height H (that is, the first height H1 is 0.5H, and the second height H2 is 0.5H), but the invention is not limited thereto. Under the above configuration, the heat dissipating structure 200 may penetrate through the circuit board 100, and has the effect of improving the heat dissipating capability.

In the embodiment, the circuit board structure 10 further includes an interface material 140 filled in the through hole 130. The interface material 140 surrounds the heat dissipating structure 200 in the through hole 130. Generally speaking, in the conventional technical fields, the method of disposing the heat dissipating column in the circuit board mainly includes disposing bumps on the side surface of the heat dissipating column, so that the heat dissipating column may be fixed in the through hole by the bumps. It is worth noting that, in the embodiment, the interface material 140 may first be disposed between the first metal block 220 and the second metal block 240, and then the first metal block 220, the second metal block 240 and the interface material 140 are disposed together in the through hole 130. Then, at a heated temperature, pressure is applied to end point of the first metal block 220 and end point of the second metal block 240. Then, the first metal block 220 and the second metal block 240 are joined in the through hole 130, and the interface 210 is formed in the through hole 130. After the first metal block 220 and the second metal block 240 are joined, there is a gap 132 between the formed heat dissipating structure 200 and the inner wall 133 of the through hole 130. The interface material 140 pressed by the first metal block 220 and the second metal block 240 may flow and be filled in the gap 132. Therefore, the viscosity of the interface material 140 may keep the heat dissipating structure 200 in the through hole 130. After the temperature is down, the interface material 140 may be solidified and disposed in the gap 132, so as to fix the heat dissipating structure 200 in the through hole 130 of the circuit board 100. Under the above configuration, the circuit board structure 10 of the present invention has the advantageous effect of simplifying manufacturing process and reducing costs.

Since the heat dissipating structure 200 of the embodiment is formed in the through hole 130, the heat dissipating structure 200 may be directly fixed to the circuit board 100 by the interface material 140. Therefore, the side surface 202 of the heat dissipating structure 200 may be a flat surface without any protrusion. Through this, as shown in FIG. 1 and FIG. 2, the interface material 140 may surround the heat dissipating structure 200 and be configured in a ring shape in the through hole 130. In this way, in addition to the simple manufacturing process of the heat dissipating structure 200, the interface material 140 may also automatically fill up the gap 132, and reduce the influence of the size tolerance on the heat dissipating structure 200 or on the through hole 130 during the manufacturing process. Therefore, the circuit board structure 10 may further have good quality.

In the embodiment, the material of the interface material 140 includes epoxy-based colloid, which has the characteristics of temperature controllable resin viscosity, but the invention is not limited thereto. In the embodiment, the volume of the interface material 140 disposed between the first metal block 220 and the second metal block 240 may be greater than or equal to the volume of the through hole 130 minus the volume of the heat dissipating structure 200. Under the above configuration, the interface material 140 may be ensured to fill up the gap 132, so that the circuit board structure 10 may have good reliability. In addition, the excess interface material 140 may flow out of the through hole 130 and remain on the first surface 102 or the second surface 104 of the circuit board 100. In the embodiment, the remaining excessive interface material 140 may be removed by grinding or chemical-mechanical polishing (CMP), but the invention is not limited thereto.

In some embodiments, after the first metal block 220 is joined to the second metal block 240, the first metal block 220 and the second metal block 240 are subjected to pressure from Z direction, so that the formed heat dissipating structure 200 may laterally deform in X and/or Y direction. In other words, the height H of the heat dissipating structure 200 may be reduced in the Z direction, and the width may be increased in the X direction and/or Y direction, resulting in a Poisson effect. Through this, the side surface 202 of the heat dissipating structure 200 may become close to or contact the inner wall 133 of the through hole 130, so as to further enhance the bonding force of the heat dissipating structure 200 and the circuit board 100. In this way, the reliability and quality of the circuit board structure 10 may be improved. In the embodiment, the X direction is perpendicular to the Y direction and the Z direction, and the Y direction is perpendicular to the Z direction.

Please refer to FIG. 1 and FIG. 3, the circuit board structure 10 also has a first metal layer 160 and a second metal layer 180. The first metal layer 160 is disposed on the conductive layer 124 of the first surface 102 of the circuit board 100 (e.g. the metal layer on one surface of the circuit board 100). The second metal layer 180 is disposed on the conductive layer 124 of the second surface 104 of the circuit board 100 (e.g. the metal layer on the other surface of the circuit board 100). In the embodiment, the first metal layer 160 and the second metal layer 180 are, for example, respectively disposed on both surfaces of the circuit board 100 (e.g. the first surface 102 and the second surface 104). The first metal layer 160 and the second metal layer 180 are, for example, copper capping layers. In this way, the first metal layer 160 and the second metal layer 180 will cover and overlap the heat dissipating structure 200 (the through hole 130 and the heat dissipating structure 200 covered by the first metal layer 160 are in dotted lines as illustrated in FIG. 3).

In the embodiment, the materials of the first metal layer 160 and the second metal layer 180 include metal materials, metal nitrides, metal silicides, or combinations thereof, such as copper foil, or other suitable conductive materials. In some embodiments, the above-mentioned metal materials may be, for example, platinum, titanium, aluminum, copper, gold, silver, tin, palladium or nickel or alloys thereof, but the invention is not limited thereto. In this way, the circuit board structure 10 may be a double-layer copper foil circuit board, but the invention is not limited thereto.

In other embodiments, the material of the first metal layer 160 or the material of the second metal layer 180 may also be the same as or different from the material of the heat dissipating structure 200. For example, the material of the heat dissipating structure 200 and the material of the first metal layer 160 or the second metal layer 180 may be copper. Or, the material of the heat dissipating structure 200 may be aluminum, and the material of the first metal layer 160 or the second metal layer 180 may be copper. Or, the material of the heat dissipating structure 200 may be titanium, and the material of the first metal layer 160 or the second metal layer 180 may be copper. However, the present invention is not limited thereto. Persons having ordinary skills in the art may select the appropriate materials of the heat dissipating structure 200, the first metal layer 160 and the second metal layer 180 according to the actual applicable requirements.

In some embodiments, the materials of the first metal block 220 and the second metal block 240 may also specifically be porous metal blocks. Under the above configuration, when the first metal block 220 is being pressed to join the second metal block 240, the first metal block 220 and the second metal block 240 may be deformed through the automatic compression of the pores (or holes) in the metal block to correspond to the size of the through hole 130 size. In this way, the size tolerance of the heat dissipating structure 200 or the through hole 130 may be further widened during the manufacturing process. Therefore, the accuracy requirements of the present invention in the manufacturing process may be reduced, which may facilitate the simplification of the manufacturing process. The yield and quality of the circuit board structure 10 may also be improved.

In addition, since the first metal block 220 and the second metal block 240 are porous metal blocks, the porous metal block has a larger heat dissipating surface area than solid metal block. Therefore, the first metal block 220 and the second metal block 240 may increase the heat dissipating surface area through these pores (or holes), thereby improving the heat dissipating efficiency of the circuit board structure 10.

It should be noted that the reference symbols and a part of the contents in the previous embodiment are used in the following embodiments, in which identical reference symbols indicate identical or similar devices. The part of the description with the identical technical content omitted may refer to the foregoing embodiment, which is not repeated in the following description.

Figure 4A:
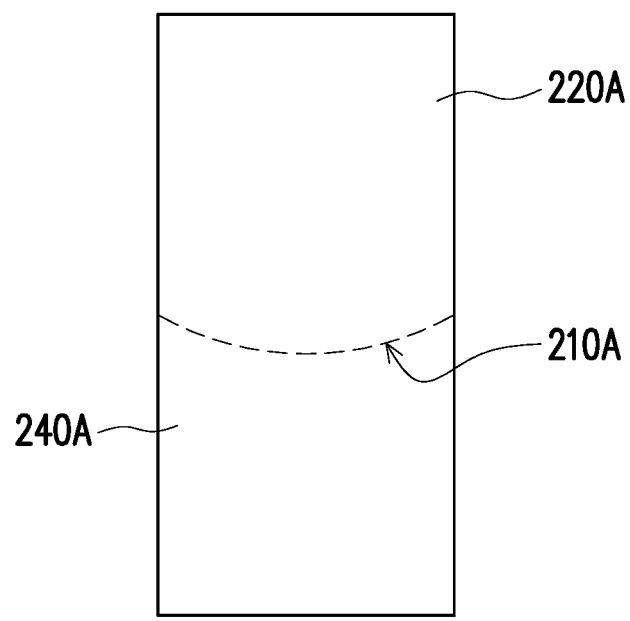
FIG. 4A is a schematic cross-sectional view of a heat dissipating structure according to another embodiment of the invention.

FIG. 4A is a schematic cross-sectional view of a heat dissipating structure according to another embodiment of the invention. Please refer to FIG. 1 and FIG. 4A. The heat dissipating structure 200A of the embodiment is similar to the heat dissipating structure 200 of FIG. 1. The main difference is that, in the embodiment, the cross section of the interface 210A of the heat dissipating structure 200A is a curved surface. Specifically, the first metal block 220A has a convex curved surface at the interface 210A, and the second metal block 240A has a concave curved surface at the interface 210A. Through this, the interface 210A is a curved surface, and the same effect as that of the above embodiment may be obtained.

Figure 4B:
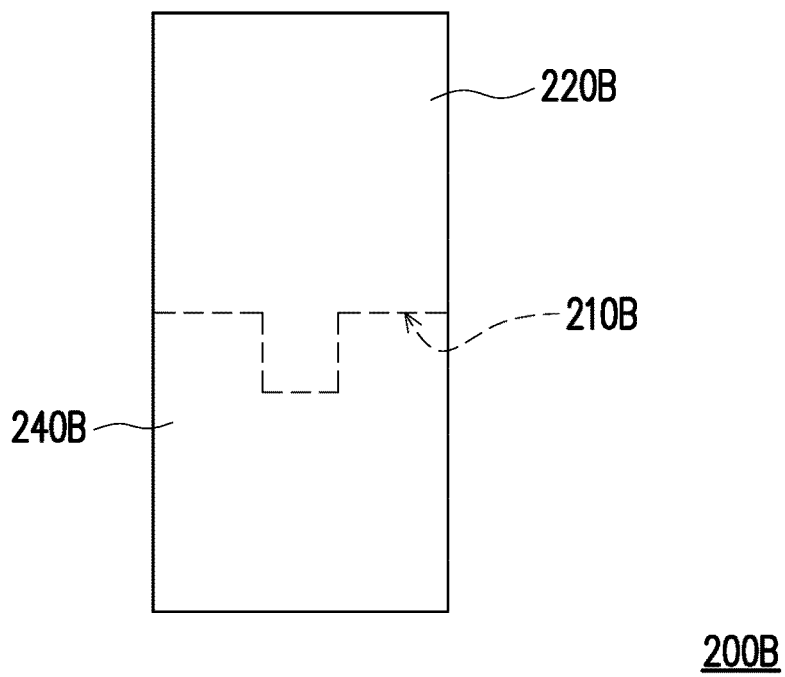
FIG. 4B is a schematic cross-sectional view of a heat dissipating structure according to another embodiment of the invention.

FIG. 4B is a schematic cross-sectional view of a heat dissipating structure according to another embodiment of the invention. Please refer to FIG. 1 and FIG. 4B. The heat dissipating structure 200B of the embodiment is similar to the heat dissipating structure 200 of FIG. 1. The main difference is that, in the embodiment, the cross section of the interface 210B of the heat dissipating structure 200B is a complementary shaped surface. Specifically, the first metal block 220B has a convex contour at the interface 210B, and the second metal block 240B has a concave contour at the interface 210B. Through this, the contour of the first metal block 220B at the interface 210B may complement the contour of the second metal block 240B at the interface 210B, and the same effect as that of the above embodiment may be obtained.

Figure 4C:
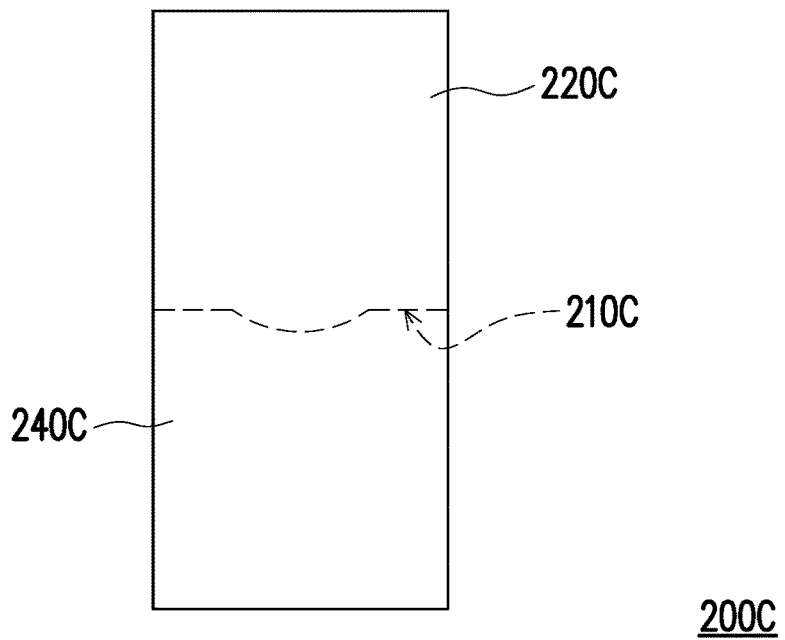
FIG. 4C is a schematic cross-sectional view of a heat dissipating structure according to yet another embodiment of the invention.

FIG. 4C is a schematic cross-sectional view of a heat dissipating structure according to yet another embodiment of the invention. Please refer to FIG. 1 and FIG. 4C. The heat dissipating structure 200C of the embodiment is similar to the heat dissipating structure 200 of FIG. 1. The main difference is that, in the embodiment, the cross section of the interface 210C of the heat dissipating structure 200C is a complementary shaped surface. Specifically, the first metal block 220C has a bump at the interface 210C, and the second metal block 240C has a dimple at the interface 210C. Through this, the bump of the first metal block 220C at the interface 210C may complement the dimple of the second metal block 240C at the interface 210C, and the same effect as that of the above embodiment may be obtained.

In other embodiments, while not deviate from the spirit and scope of the present invention, persons having ordinary skill in the art, should understand that any other shapes that are complementary to each other may be used as the shape of the interface between the first metal block and the second metal block. The shape of the interface is not limited to the drawings illustrated in the invention. For example, the shape of the interface between the first metal block and the second metal block may also be a complementary saw-tooth shape, a complementary wave shape, a complementary cog shape, or a complementary star shape, but the invention is not limited thereto.

Figure 5:
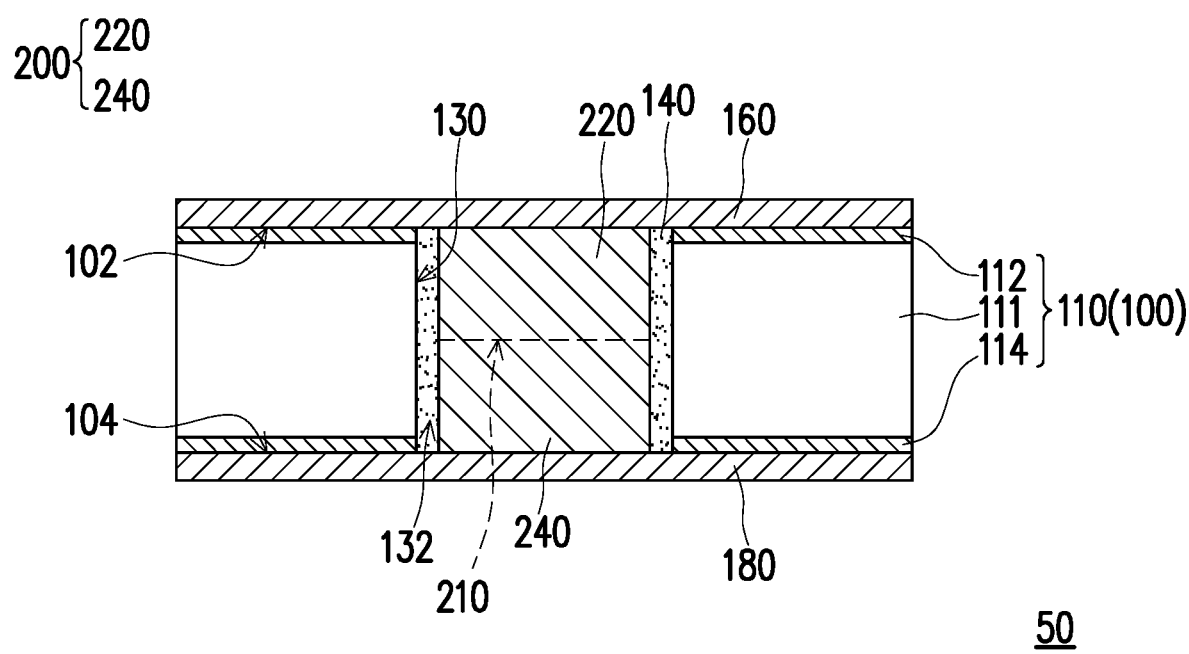
FIG. 5 is a schematic cross-sectional view of a circuit board structure according to another embodiment of the invention.

FIG. 5 is a schematic cross-sectional view of a circuit board structure according to another embodiment of the invention. Please refer to FIG. 1 and FIG. 5. The circuit board structure 50 of the embodiment is similar to the circuit board structure 10 of FIG. 1. The main difference is that. in the embodiment, the circuit board structure 50 is, for example, a double-layer circuit board.

In the embodiment, the circuit board structure 50 includes a circuit board 100, and metal layers are respectively disposed on the two opposite surfaces of the circuit board 100. Specifically, the circuit board 100 includes an inner layer circuit board 110. The first conductive layer 112 (also referred to as the metal layer on one surface of the circuit board 100) is disposed on the first surface 102 of the circuit board 100 (may also be referred to as the upper surface of the inner layer circuit board 110). The second conductive layer 114 (also referred to as the metal layer on the other surface of the circuit board 100) is disposed on the second surface 104 of the circuit board 100 (may also be referred to as the lower surface of the inner layer circuit board 110). The through hole 130 is disposed in the circuit board 100 and penetrates through the circuit board 100.

The first metal block 220 and the second metal block 240 are joined in the through hole 130 and have the interface 210 between the first metal block 220 and the second metal block 240, so as to constitute the heat dissipating structure 200. The interface material 140 fills up the gap 132 of the through hole 130 and surrounds the heat dissipating structure 200. Through this, the heat dissipating structure 200 is fixed in the circuit board 100.

The first metal layer 160 is disposed on the conductive layer 124 on the first surface 102 of the circuit board 100. The second metal layer 180 is disposed on the conductive layer 124 on the second surface 104 of the circuit board 100. Through this, the first metal layer 160 and the second metal layer 180 may be used as a copper capping layer disposed on both surfaces of the circuit board 100 (e.g. the first surface 102 and the second surface 104). In this way, the first metal layer 160 and the second metal layer 180 will cover and overlap the heat dissipating structure 200, and the same effect as that of the above embodiment may be obtained.

In summary, since the circuit board structure of an embodiment of the present invention has a heat dissipating structure penetrating through the circuit board, so as to quickly and efficiently transfer heat energy from one side of the circuit board to the other side. Therefore, the circuit board structure has good heat dissipating capability. In addition, the interface material may simply fill up the through hole and surround the heat dissipating structure, so as to fix the heat dissipating structure in the through hole of the circuit board. In this way, the surface of the heat dissipating structure may be flat, and the manufacturing process may be simplified. Therefore, the circuit board structure has the advantageous effect of reducing costs. In addition, the interface material may also automatically fill up the gap, and reduce the influence of the size tolerance on the heat dissipating structure or the through hole during the manufacturing process. Therefore, in addition to the simplified manufacturing process, the circuit board structure further has good quality. In addition, the first metal block and the second metal block of the circuit board structure of the present invention may also be porous metal blocks. In addition to improving the heat dissipating efficiency, the accuracy requirements in the manufacturing process may also be further reduced. Through this, the yield and quality of the circuit board structure of the embodiment may be further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board structure, comprising:
   a circuit board, the circuit board has two opposite surfaces, and a metal layer is disposed on each of the surfaces;
   at least one through hole is disposed in the circuit board, and the at least one through hole penetrates through the circuit board; and
   at least one integrally formed heat dissipating structure is disposed in the at least one through hole, the at least one integrally formed heat dissipating structure comprising:
   a first metal block; and
   a second metal block, the first metal block and the second metal block are joined in the at least one through hole to form the integrally formed heat dissipating structure, and the integrally formed heat dissipating structure has an interface at where the first metal block joined the second metal block.

2. The circuit board structure according to claim 1, further comprising an interface material filled in the at least one through hole and surrounding the at least one heat dissipating structure, wherein a gap is between the at least one heat dissipating structure and an inner wall of the at least one through hole, and the interface material is disposed in the gap, so as to fix the at least one heat dissipating structure in the circuit board.

3. The circuit board structure according to claim 1, wherein a side surface of the at least one heat dissipating structure is a flat surface without protrusions.

4. The circuit board structure according to claim 1, wherein after the first metal block is joined to the second metal block, the at least one heat dissipating structure is laterally deformed.

5. The circuit board structure according to claim 1, wherein the interface is in between the first metal block and the second metal block, and the crystal lattice of the first metal block on one side of the interface and the crystal lattice of the second metal block on an opposite side of the interface are discontinuously arranged.

6. The circuit board structure according to claim 5, wherein a cross section of the interface is a complementary shaped surface between the first metal block and the second metal block.

7. The circuit board structure according to claim 1, wherein the material of the first metal block and the second metal block comprises metal materials or metal alloys selected from platinum, titanium, aluminum, copper, gold, silver, tin, and nickel.

8. The circuit board structure according to claim 7, wherein the first metal block and the second metal block are respectively the same or different metal materials, or the same or different alloys.

9. The circuit board structure according to claim 1, wherein the circuit board has an inner layer circuit board and a plurality of circuit build-up layers stacked on two opposite surfaces of the inner layer circuit board.

10. The circuit board structure as described in claim 1, further comprising:
    a first metal layer disposed on the metal layer on a first surface of the circuit board; and a second metal layer disposed on the metal layer on a second surface of the circuit board opposite to the first surface, wherein the first metal layer and the second metal layer overlap the at least one heat dissipating structure.

11. The circuit board structure according to claim 1, wherein the first metal block and the second metal block are porous metal blocks.

12. The circuit board structure according to claim 1, wherein the first metal block and the second metal block are pressed to be joined in the at least one through hole.

\* \* \* \* \*